United States Patent
Willard et al.

(10) Patent No.: US 7,185,427 B2
(45) Date of Patent: Mar. 6, 2007

(54) METHOD FOR MAKING ELECTRICAL CONNECTIONS TO AN ELEMENT ON PRINTED CIRCUIT BOARD

(75) Inventors: Stephen Willard, Fort Collins, CO (US); Philip N King, Ft Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 191 days.

(21) Appl. No.: 10/424,615

(22) Filed: Apr. 28, 2003

(65) Prior Publication Data

US 2004/0211593 A1    Oct. 28, 2004

(51) Int. Cl.
*H01R 9/00*   (2006.01)
*H05K 3/00*   (2006.01)

(52) U.S. Cl. ............ 29/842; 29/830; 29/832; 29/850; 29/947; 174/60.5; 174/261; 174/266; 361/736; 361/748

(58) Field of Classification Search ........... 29/842, 29/830, 832, 947, 850; 174/60.5, 261, 266; 361/736, 748
See application file for complete search history.

(56) References Cited

U.S. PATENT DOCUMENTS

| 4,438,560 A | * | 3/1984 | Kisters | .................. | 29/830 |
| 4,907,127 A | * | 3/1990 | Lee | .................. | 361/748 |
| 5,165,166 A | * | 11/1992 | Carey | .................. | 29/847 |

* cited by examiner

*Primary Examiner*—A. Dexter Tugbang
*Assistant Examiner*—Tim Phan
(74) *Attorney, Agent, or Firm*—Cynthia S. Mitchell

(57) ABSTRACT

The present invention is directed to a method for an electrically conductive structure on a printed circuit board for connecting an element on the printed circuit board with other elements. The electrically conductive structure may include a contact pad on a first side of the printed circuit board and two or more connection pads on the first side of the printed circuit board. The two or more connection pads are in close physical proximity to the contact pad and electrically connected to the contact pad. The element on the printed circuit board is directly connected to one the two or more connection pads electrically. The structure permits various engineering changes to the electrical connections of elements on the printed circuit board by desoldering electrical connections to the two or more connection pad, by severing traces to the connection pads, or by severing the electrical connection between the connection pads and the contact pad.

2 Claims, 13 Drawing Sheets

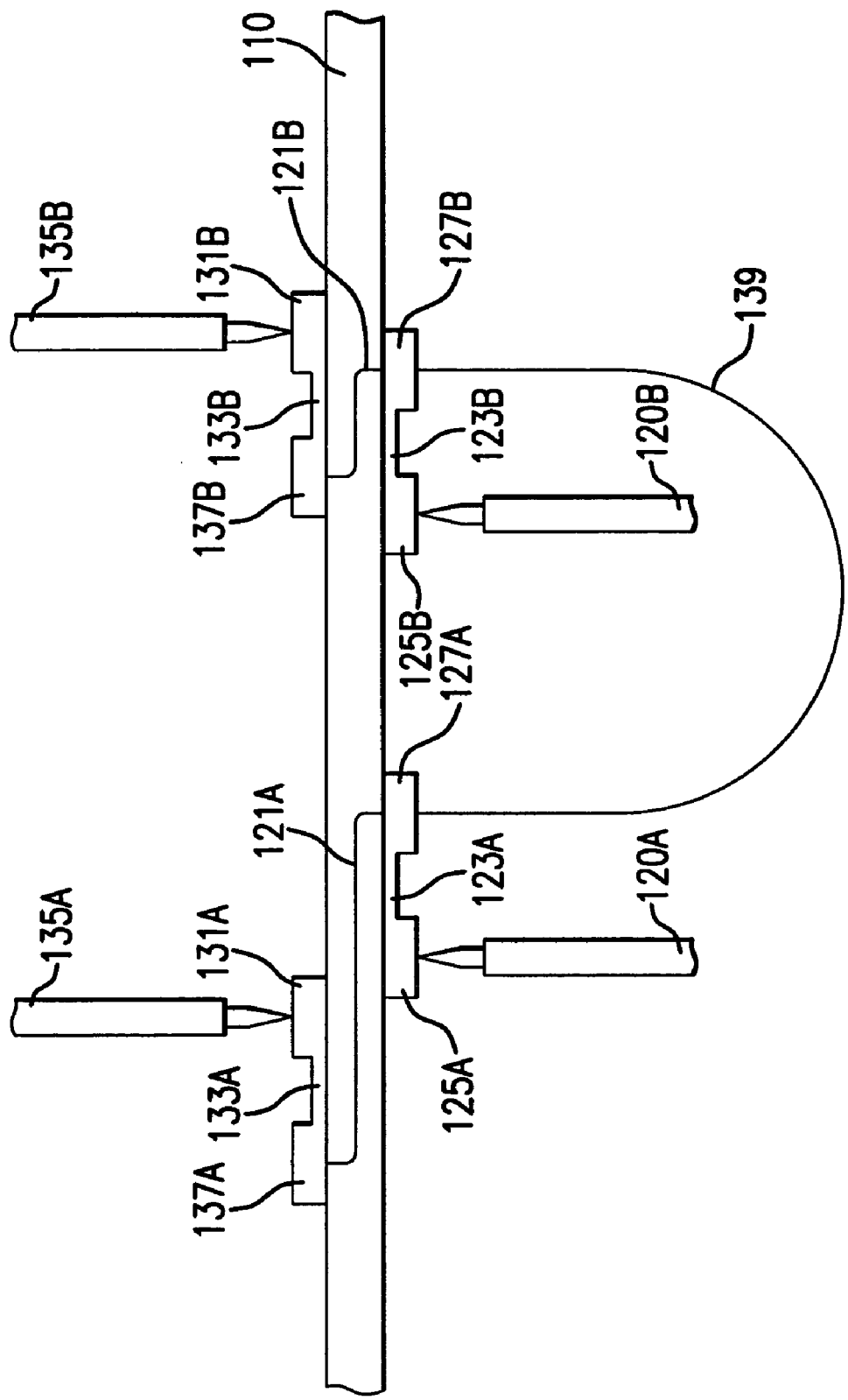

METHOD FOR MAKING ELECTRICAL CONNECTIONS TO AN ELEMENT ON PRINTED CIRCUIT BOARD

BACKGROUND

The present invention pertains generally to printed circuit board layout, and more particularly to a novel method and apparatus related to printed circuit board contact pads.

Frequently, engineers may decide to make changes to the layout of a printed circuit board. These changes may be due to one of many reasons, including correcting errors, product improvements, revisions or improving the layout of a printed circuit board. There may be additional connections made to contact pads on the printed circuit board, rerouted connections, wrong connections removed and reconnected to the correct contact pad. Often, there are numerous engineering changes to a printed circuit board, including rerouting of numerous connections between pads on the printed circuit board. If the printed circuit board has already been manufactured, this may be very difficult and expensive to re-engineer the connections to the contact pads.

By way of example only, one area in which re-engineering of a printed circuit board happens frequently is in the printed circuit board (PCB) automatic tester environment. A simplified diagram of one such PCB tester is shown in FIG. 1. A target PCB 105, typically populated with electronic components 107, is held in a stable fashion by a target board support 130. A plurality of probes 135 make contact at one end with points of interest on the target PCB 105 to be tested. The other end of each probe 135 makes contact with electrical contact points on one side of a fixture PCB 110. On the opposite side of the fixture PCB 110 are another set of electrical contact points, each of which is associated with a pin 120. The pins 120 are utilized to connect various points of the fixture PCB 110, with a resource of tester 150 via testing interface 115, shown without detail in FIG. 1.

Thus, the fixture PCB 110 is employed as a way of mechanically customizing the testing interface 115 for any particular target PCB 105. Typically, significant forces are applied to one or both sides of the fixture PCB 110 by way of the probes 135 and the pins 120. To prevent inordinate flexing of the fixture PCB 110 under such forces, structural elements, such as spacers 140 and fixture adapter 111, are employed. These structural elements may predominantly reside on the upper or lower side, or both, of the fixture PCB 110.

Often, changes to the connections embodied in the fixture PCB 110 are required. These changes are necessitated by modifications in test strategy, causing a change in the number of points of interest to by checked on the PCB 105, a modification in how the points of interest are tested, a correction to the test methodology or a correction to the design of the PCB 105. Also, a design modification to the target PCB 105 may cause a change of location in the points of interest on the target PCB 105. As a result of these modifications or corrections, commensurate changes in the location or number of the probes 135, or in how the probes 135 are connected to the pins 120, may be required. In such cases, changes in the electrical connections implemented within the fixture PCB 110 are necessary.

FIG. 2A shows a blown-up, simplified fixture PCB 110 with under side interface pins 120A and 120B making contact with contact pads 125A and 125B, respectfully. Contact pads 125A and 125B are electrically connected to connection pads 127A and 127B via traces 123A and 123B. Connection pads 127A and 127B are electrically connected to connection pads 137A and 137B on the topside of the fixture PCB 110 via internal PCB trace 121A and 121B. Test probes 135A and 135B make electrical contact with contact pads 131A and 131B, which are electrically connected with connection pads 137A and 137B via trace 133A and 133B. If an engineering change order, design change, test change or other reason requires an electrical connection between the resource of contact pad 125A and the resource of contact pad 125B, an electrical connection is made via small-gauge wire-wrap wire 139, or other known connection means between connection pad 127A and connection pad 127B, as shown in FIG. 2B. It is difficult to make multiple contacts to a single contact pad. Engineering change order and other electrical connections are typically made between the connection pads 127A and 127B, as connecting wires or soldering directly to the contact pads 125A and 125B would degrade the electrical qualities of contact pad 125A and 125B.

Additional electrical connections can be made to connection pad 127A via small-gauge wire-wrap 141 and other resource connection pads on the PCB 110, as shown in FIG. 2C. On a large complex PCB, removing resources is difficult. Therefore, if engineering change orders or other design modifications later require the removal of a resource from the layout; the exposed electrical trace 123A is severed between the contact pad 125A and the connection pad 127A. This effectively removes the test resource interface pin 120A from the test probe 135A. Once a resource has been removed from the design layout, it is difficult to recover the resource.

Accordingly, there is a need for a simple method to reroute interconnect on a PCB, disconnect resources and reclaim disconnected resources on a PCB during multiple revisions and engineering change orders to the PCB.

SUMMARY

Embodiments of the present invention, which is discussed in detail below, represent a structure and method that permits engineering changes to the electrical connections of elements on a printed circuit board after assembly.

The apparatus may include an electrically conductive structure on a printed circuit board for connecting an element on said printed circuit board with other elements, comprising a contact pad on a first side of the printed circuit board, and two or more connection pads on the first side of the printed circuit board, wherein the two or more connection pads are in close physical proximity to the contact pad and are electrically connected to the contact pad by electrically conductive traces on the surface of the first side of the printed circuit board, wherein the element on the printed circuit board is directly connected to one of two or more connection pads electrically.

The invention may include a multiple pad structure connected to an element on a printed circuit board comprising a contact pad, a primary connection pad electrically connected to the contact pad by a trace on the surface of the printed circuit board; and a secondary connection pad electrically connected to the contact pad by a trace on the surface of the printed circuit board.

A method for manufacturing a multiple pad structure on a printed circuit board, may comprise forming an electrically conductive contact pad on a first surface of the printed circuit board; forming an electrically conductive primary connection pad on the first surface of the printed circuit board in close proximity to the contact pad; forming an electrically conductive secondary connection pad on the first surface of the printed circuit board in close proximity to the contact pad and the primary connection pad; electrically connecting the contact pad, the primary connection pad and the secondary connection pad with electrically conductive traces on the surface of the printed circuit board; wherein the traces connecting the contact pad, primary connection pad and secondary connection pad in such a manner that if the primary connection pad trace is severed, the contact pad and the secondary pad will remain electrically connected to each other, but neither will remain electrically connected with the primary connection pad.

Other aspects and advantages of the present invention will become apparent from the following detailed description, taken in conjunction with the accompanying drawings, illustrating by way of example the principles of the invention.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 2B illustrates a simplified, side view of a tester fixture PCB from the prior art;

DETAILED DESCRIPTION

Figure 1:
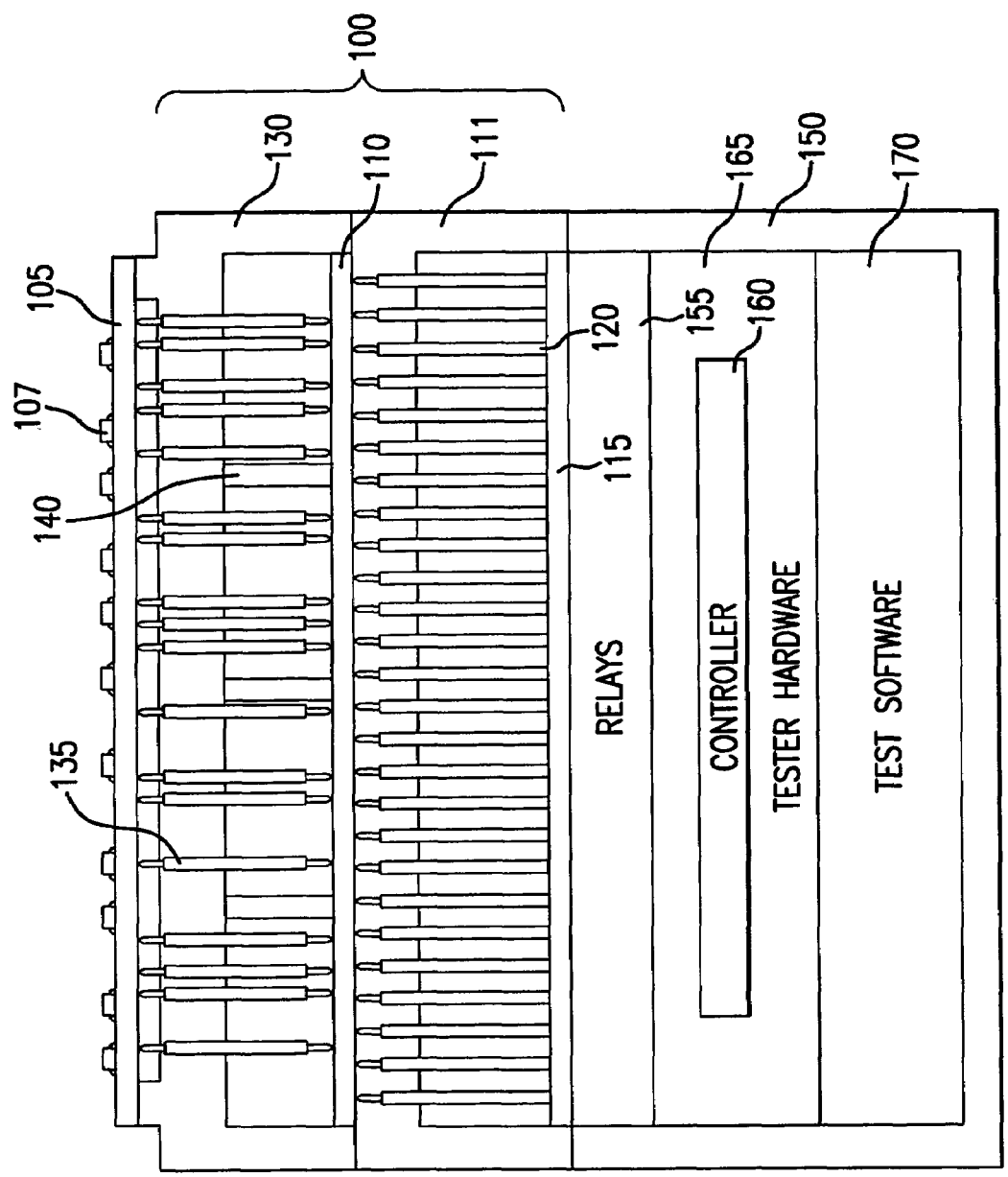
FIG. 1 illustrates a simplified side view of a test fixture for a printed circuit board tester from the prior art.

As shown in the drawings for purposes of illustration, the present invention relates to techniques for providing circuit changes to a printed circuit board (PCB), which allows for resources to be connected, disconnected or reclaimed.

Figure 3A:
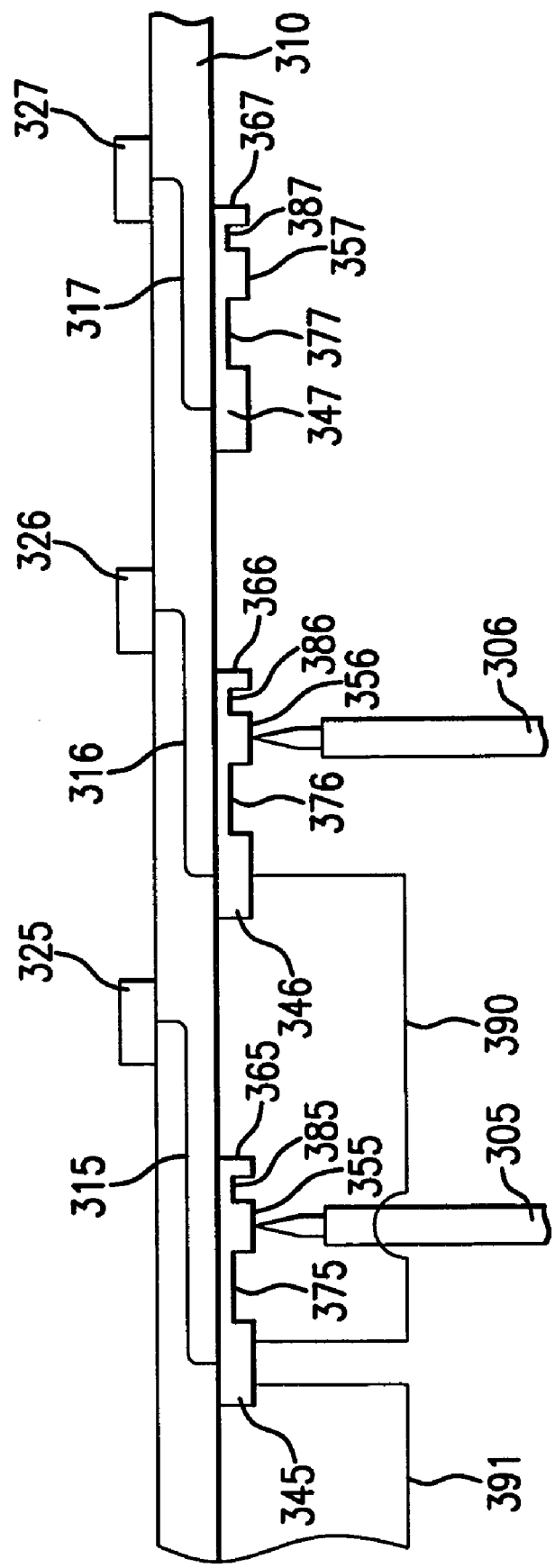
FIG. 3A illustrates a simplified, side view of a PCB with connections to connection pads in accordance with one embodiment of the present invention.
Figure 3B:
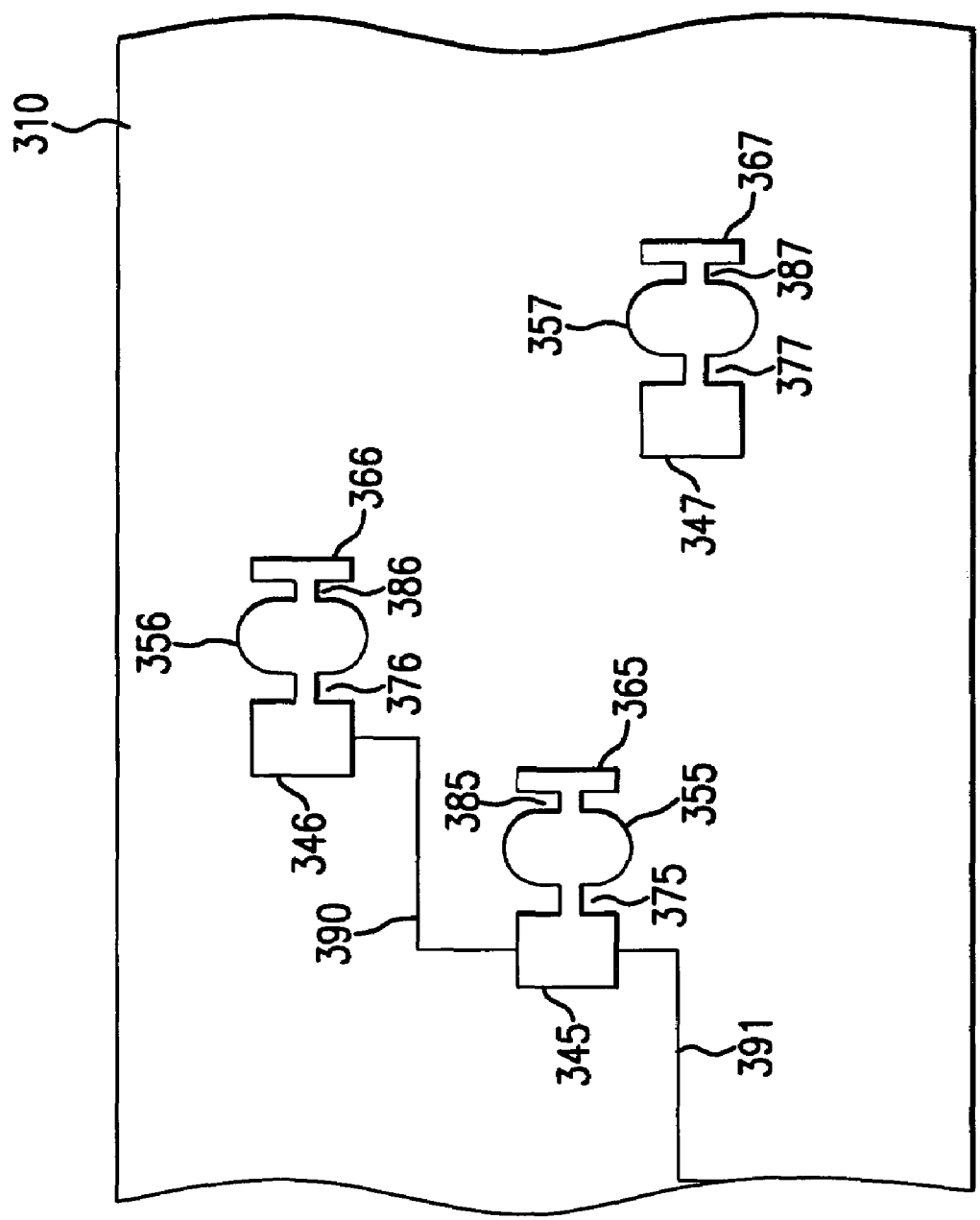
FIG. 3B illustrates a simplified, top view of a PCB of the present invention according to FIG. 3A.

Turning now to the drawings, FIGS. 3A and 3B show a simplified PCB 310 exhibiting a circuit change for electrically connecting two or more resources on the PCB 310 employing an embodiment of the present invention. The PCB 310 may be a fixture PCB for an in-circuit tester, but the embodiments of the invention described herein may also be applied to any situation calling for circuit changes to any PCB after manufacture. A resource (not shown) with a contact pad 355 has an electrical connection to element 325 via internal trace 315, an electrical connection to primary connection pad 345 via external trace 375, and an electrical connection to a secondary connection pad 365 via external trace 385 is shown. A second resource with a contact pad 356 has an electrical connection to element 326 via internal trace 316, an electrical connection to primary connection pad 346 via external trace 376, and an electrical connection to a secondary connection pad 366 via external trace 386 is also shown.

Assuming an engineering change order requires the first and second resources to be electrically connected, such connection may be accomplished with a small-gauge wire-wrap wire, electrically conductive tape, small-gauge magnet wire or other known means 390 between primary contact pads 345 and 346. Electrical connection 390 may be connected to primary contact pads 345 and 346 by means of soldering, conductive adhesive, or other known connection means. One or more other electrical connections 391 may also be made between contact pads 345, 346 and 347 and other resources on the PCB (not shown).

Primary connection pad 345 may have a via or internal connections 315 through the PCB 310, routing along one or both sides of the PCB 310 or routing along one side of the PCB 310 and then a via that connects to the other side of the PCB. Generally, all electrical connections to the test point 325 are made to the primary connection pad 345 until an engineering change or circuit modifications requires severing test point 325. Routing is made to primary connection pad 345 via internal PCB routing 315. Contact pad 355 is used for making contact with probe 305 or other known contact means. Generally, electrical connections are not made directly to contact pad 355, as soldering and other connection means may deteriorate the quality of contact pad 355 for making contact connections with probe 305.

Figure 4A:
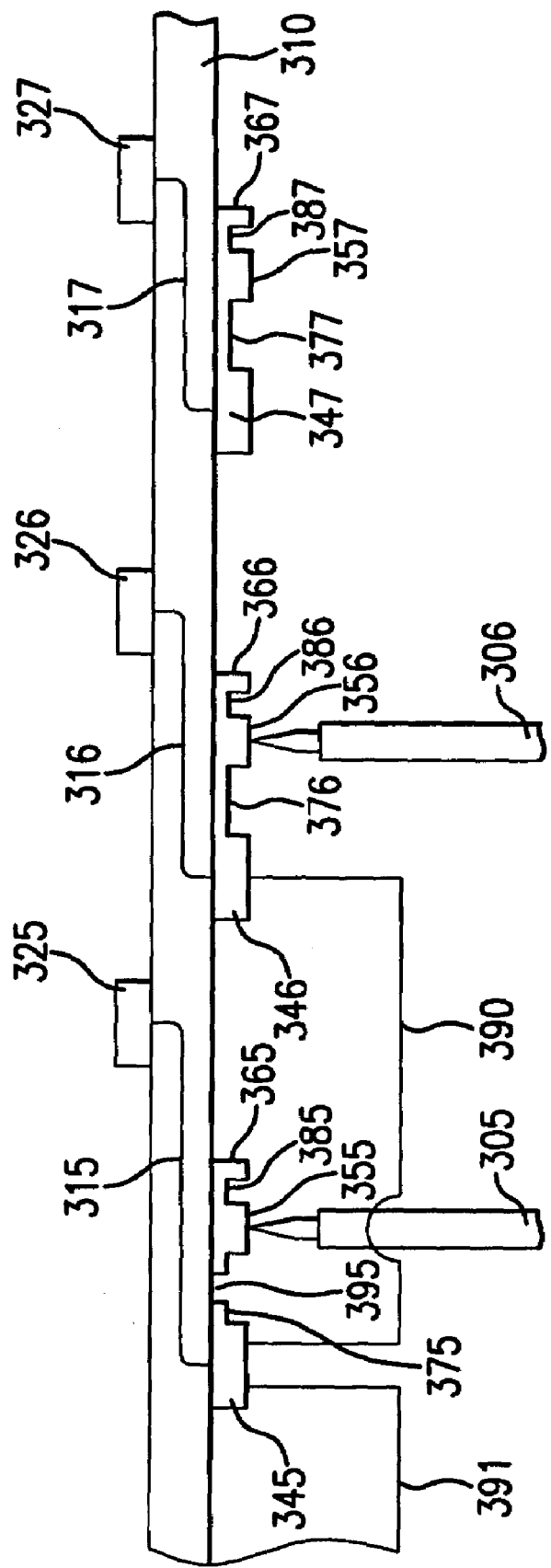
FIG. 4A illustrates a simplified, side view of a PCB with a severed resource in accordance with one embodiment of the present invention.
Figure 4B:
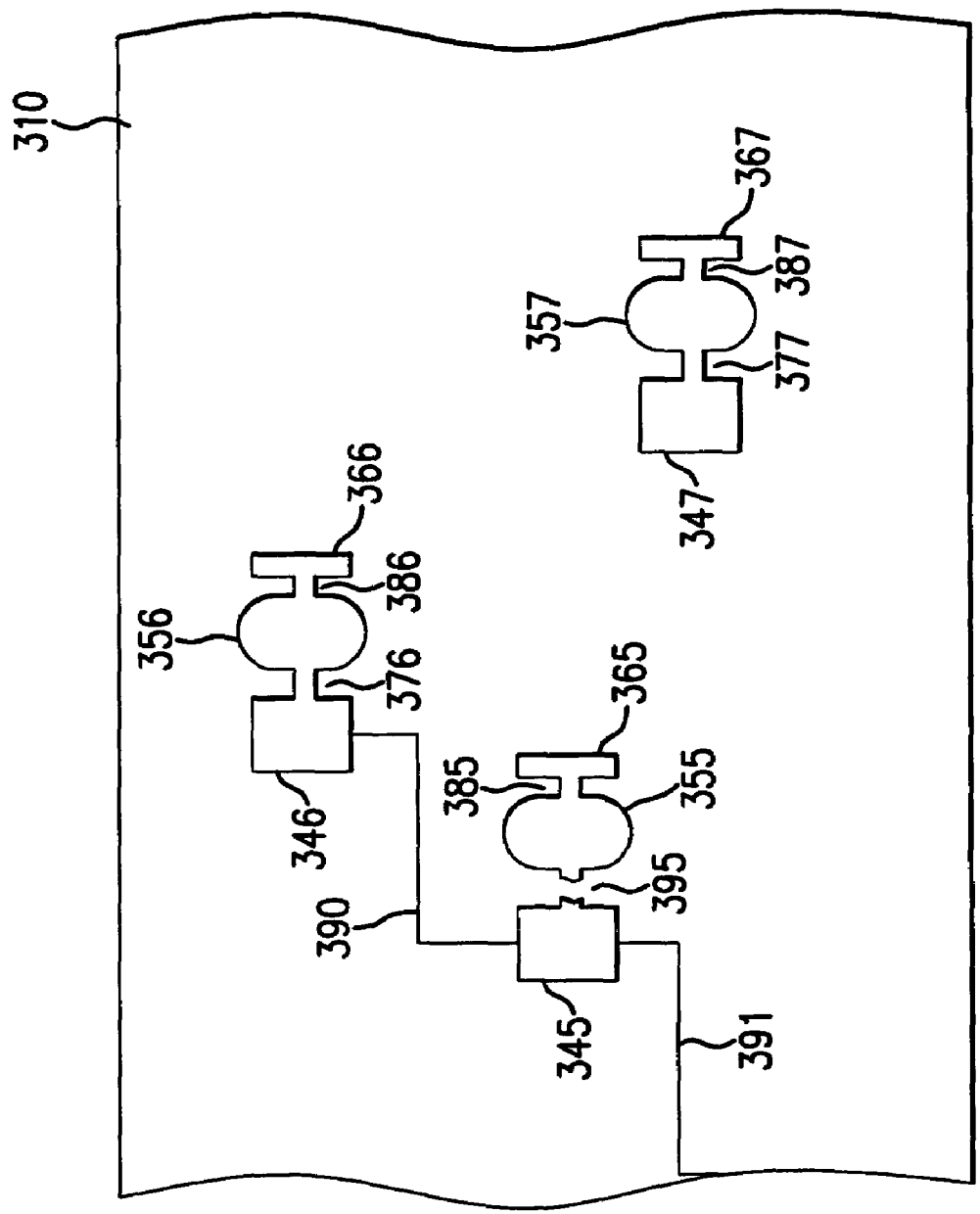
FIG. 4B illustrates a simplified, top view of a PCB of the present invention according to FIG. 4A.

FIGS. 4A and 4B show a PCB 310 with primary connection pad 345 severed from the contact pad 355, secondary contact pad 365 and other resources at 395. Connection pad 345 may be severed from connection pad 355 by cutting the connection 375. This may be accomplished by an x-acto knife, laser, dremel tool or other cutting means. Once primary contact pad 345 is severed from contact pad 355, the circuit element 325 is removed from the probe 305. As shown in FIGS. 4A and 4B, circuit element 325 may still be connected to other probes 390, 391, which may be severed as well, if such circuit changes are required.

Figure 5A:
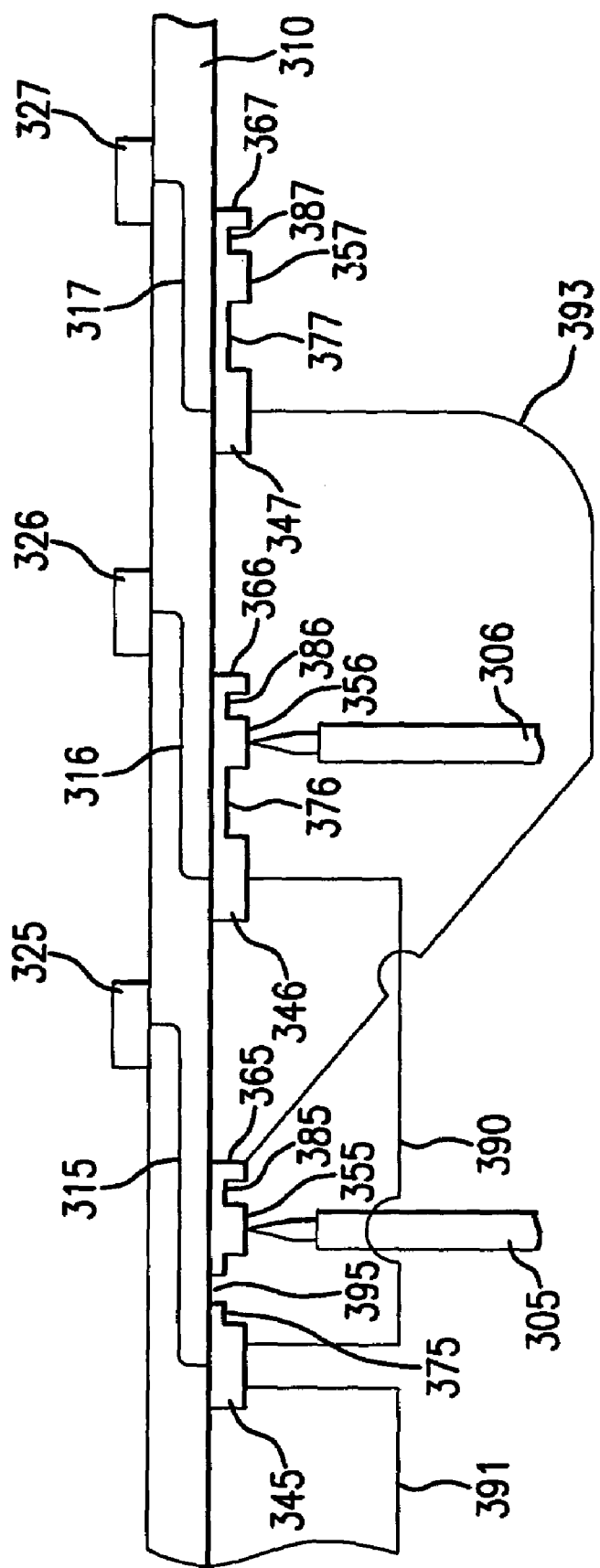
FIG. 5A illustrates a simplified, side view of a PCB with a reclaimed resource in accordance with one embodiment of the present invention.
Figure 5B:
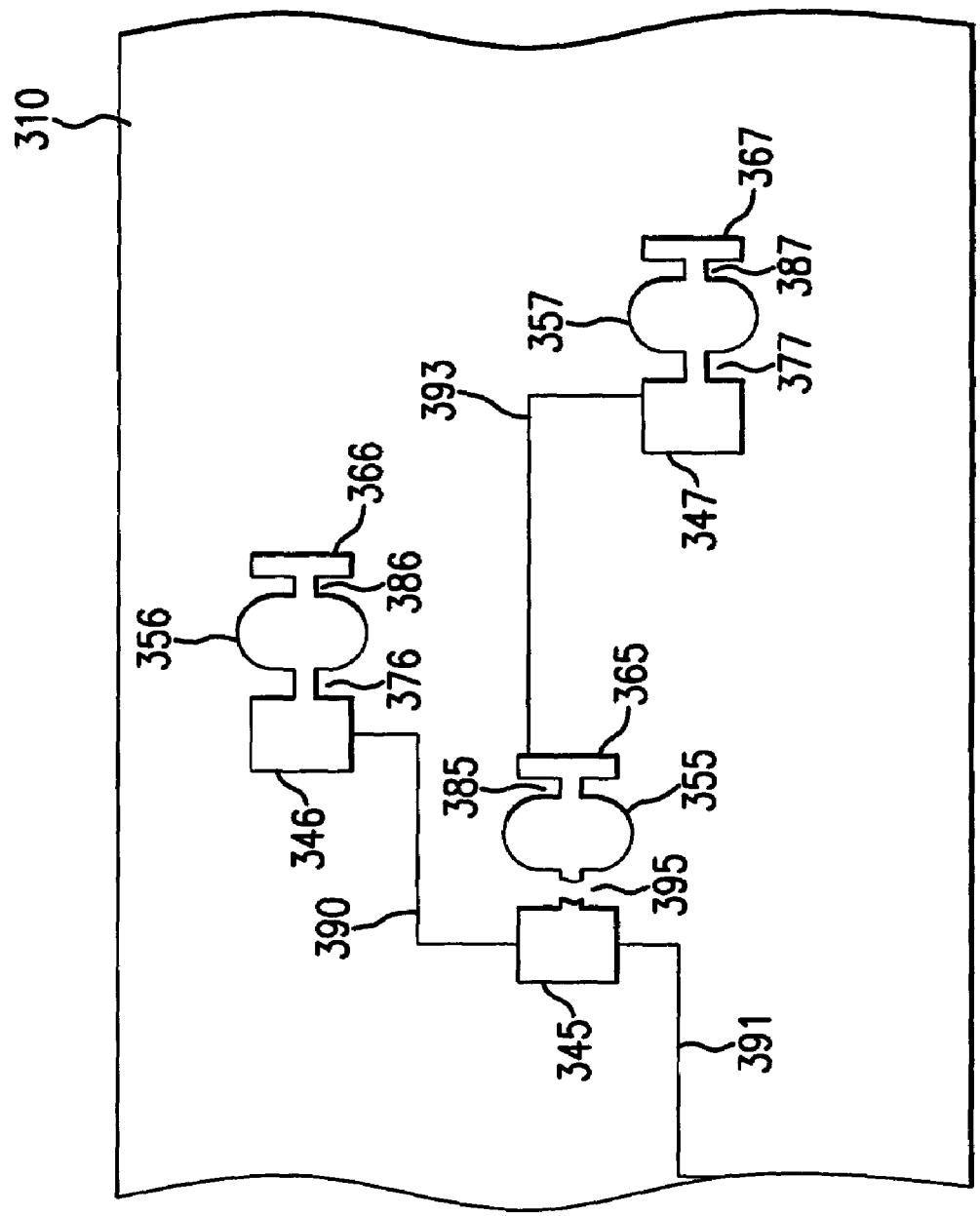
FIG. 5B illustrates a simplified, top view of a PCB of the present invention according to FIG. 5B.

FIGS. 5A and 5B show a PCB 310 with a reclaimed resource probe 305 via connection 393 between secondary connection pad 365 and primary connection pad 347. Electrical connection 393 may be made with small-gauge wire-wrap, electrically conductive tape, small-gauge magnet wire or other known connecting means. Connecting secondary pad 365 to primary pad 347 permits the resource connected to probe 305 to be reclaimed following a circuit change that severed the resource from prior circuit element(s) 325.

Figure 2A:
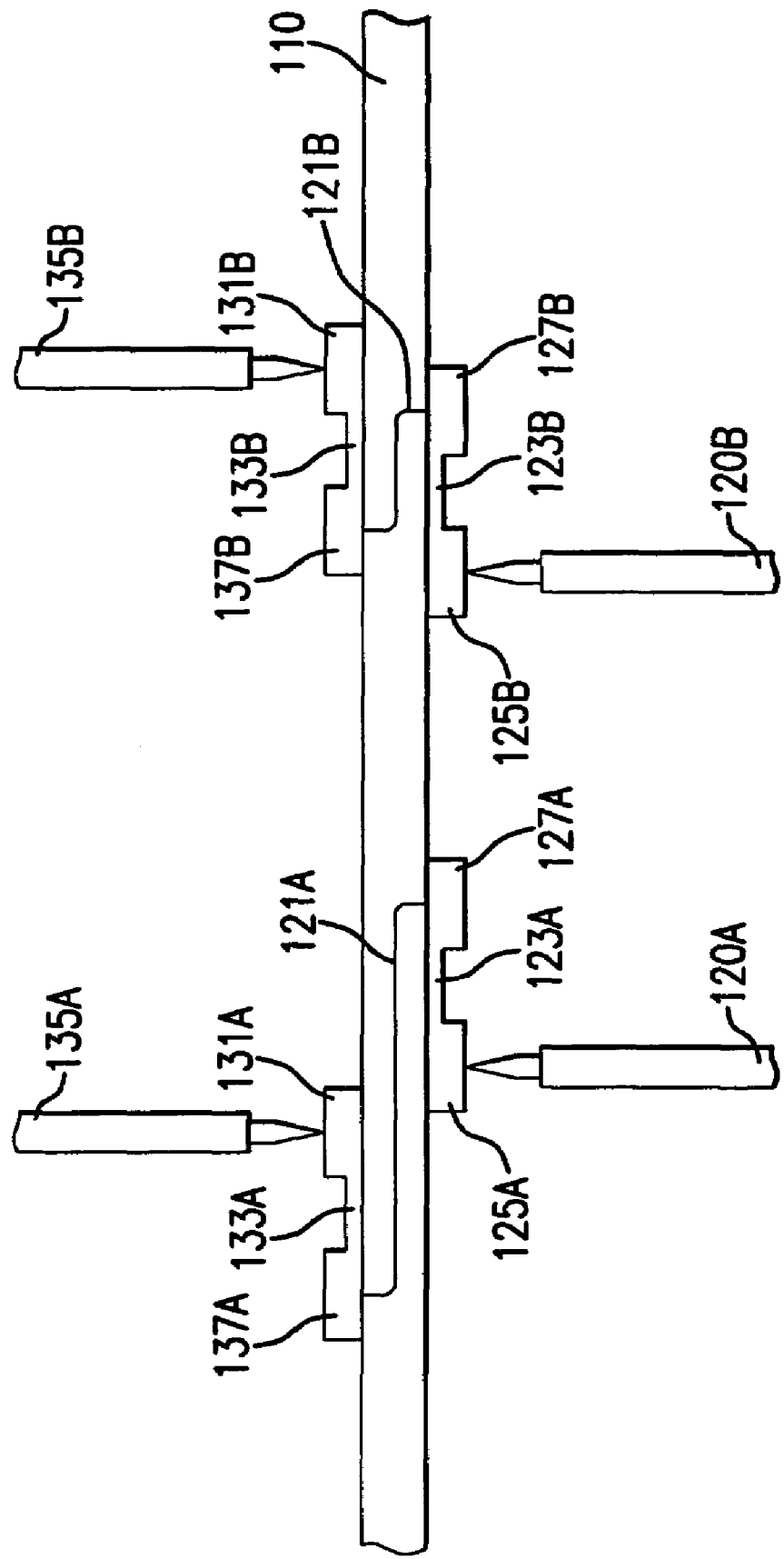
FIG. 2A illustrates a simplified, side view of a tester fixture PCB from the prior art.
Figure 2C:
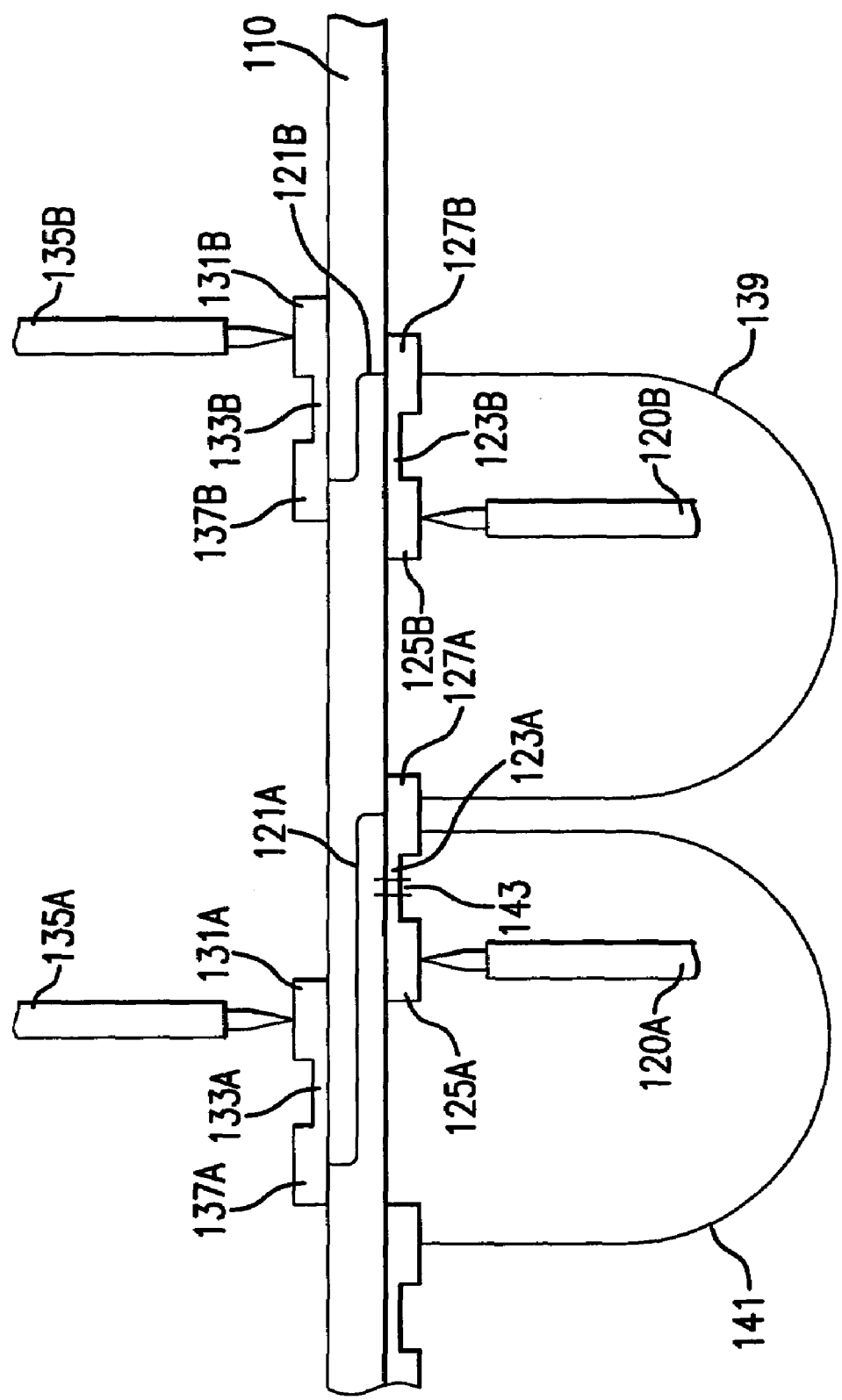
FIG. 2C illustrates a simplified, side view of a tester fixture PCB from the prior art.

One example of a use for circuit changes requiring surface wiring, severing and reclaiming of severed resources is in the printed circuit board testing or automatic test industry. As shown and described previously in FIGS. 1, 2A and 2B automatic tester 150 tests a printed circuit board 105. The automatic tester 150 interfaces test resource probes 120 with points of interest on printed circuit board under test 105 via a test fixture interface board 110 mapped to test probes 135. Test resource probes 120 make contact with contact pads 125, which are mapped to contact pad 131 via surface trace 123, connection pad 127, internal routing 121, connection pad 137 and surface trace 133. If a testing change requirement or a change to the PCB under test 105 calls for removing test resource pin 120 from the testing program, the surface trace 123 can be severed to accommodate the change to the testing routine. However, in the past, if a later circuit change to the PCB under test 105 or to the test program required using severed test resource 120, it was very difficult, if not impossible to use test resource pin 120 after it had been severed from the connection pad 127. In the past, once the test resources are exhausted, any further testing changes require a new test fixture PCB 110 or significantly prohibitive rework on the old fixture PCB 110.

As shown in FIGS. 3A, 3B, 4A, 4B, 5A, and 5B, according one embodiment of the present invention, contact pads 355 may be connected to a primary connection pads 345 and a secondary connection pads 365. Therefore, initial circuit connections can be made to primary connection pads 345. Once a testing change requirement or circuit change requirement no longer needs test resource pin 305, primary connection pad 345 is severed from contact pad 355. If later engineering, testing or circuit changes require the use of test resource pin 305, making a surface connection 393 to another circuit element 347 can reclaim contact pad 355. While the present invention is described using a printed circuit automatic tester scenario, it should be quite apparent that the concept of a contact pad having several connection pads connected via a surface trace, which enables multiple connections to a primary connection pad, severing of the primary connection pad from the contact pad by cutting the surface trace between the two pads and later reclaiming the contact pad by making a surface connection with a solder wire connection, foil tape, etc can be used in any printed circuit board setting in which circuit modifications, error corrections or product revisions may require connecting, severing and reclaiming contact and connection pads on a printed circuit board.

It will also be appreciated that while in the present example in printed circuit board testing, a contact pad 355 to resource pin 305 may need to be severed from the test system. Therefore, all connections are made to primary pin 345, so that if it later becomes necessary to sever the resource pin 305, a simple severing of surface trace 375, removes the resource pin 305 from all connections. If the resource pin is later desired for use in the test system, it may be reclaimed by making a connection with secondary contact pad 365, which is electrically connected with test resource pin via contact pad 355 and surface trace 385. Obviously, it will be appreciated that secondary connection pad 365 may also be severed from the contact pad 355 by severing the surface trace 385. However, if the connections to connection pad 365 are removed by desoldering, this will permit connection pad 365 to be reused later, if needed without degrading the quality of the contact pad 355.

It will further be appreciated that more than three connection pads may be used in certain settings with the requirements for future circuit changes and surface area as design guidelines. It will also be appreciated, that initial internal routing may be to contact pad 355. Under such a scheme, severing surface trace 375 would sever later added connections, but not the test resource (if being used in an automatic testing environment) or other initial, internal connections made to the contact pad. However, in some situations, it is actually the original connections that it is desirable to remove and having internal connections made to contact pad 355, makes removal of the original connections in such situations difficult, so connections may also be made to connection pad 345 in such situations.

Figure 6:
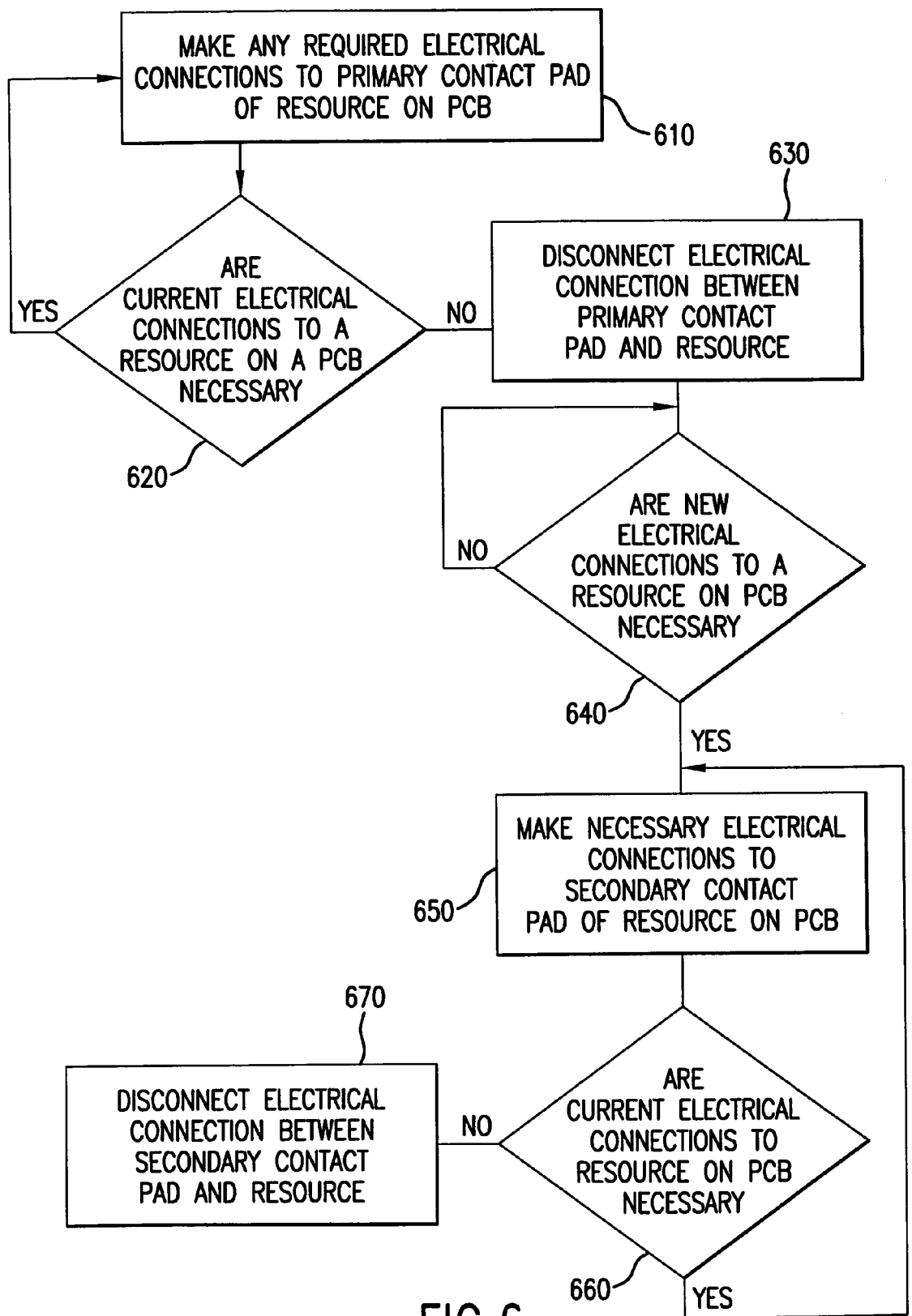
FIG. 6 illustrates a flow chart describing a method of connecting, disconnecting and reclaiming resources on a PCB according to one embodiment of the present invention.
Figure 7:
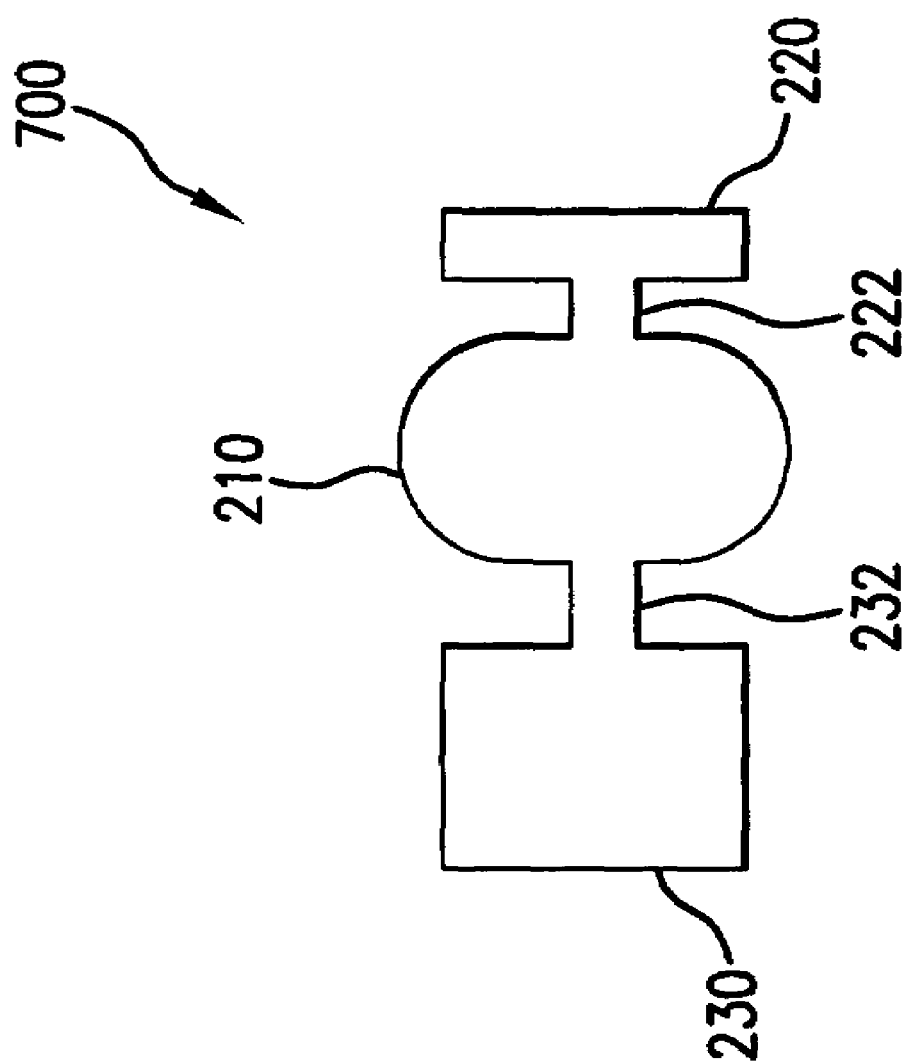
FIG. 7 illustrates a top view of a pad design according to a first embodiment of the present invention.
Figure 8:
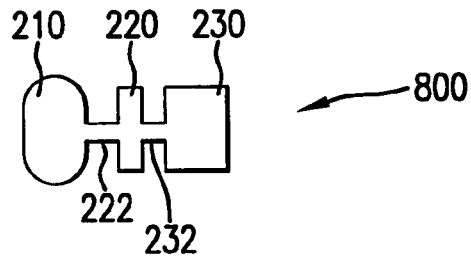
FIG. 8 illustrates a top view of a pad design according to a second embodiment of the present invention.
Figure 9:
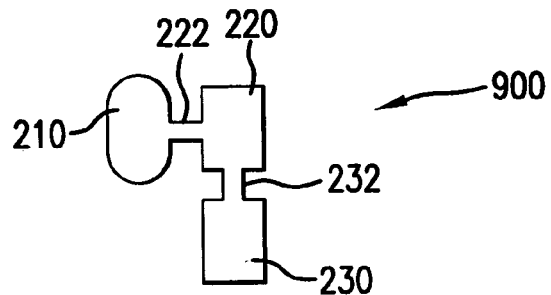
FIG. 9 illustrates a top view of a pad design according to a third embodiment of the present invention.
Figure 10:
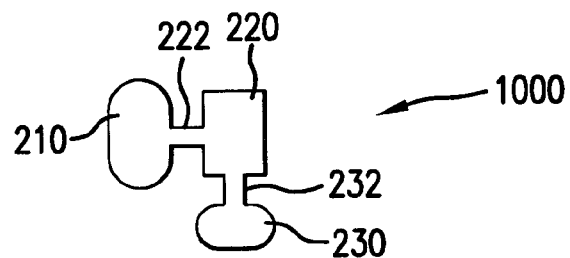
FIG. 10 illustrates a top view of a pad design according to a fourth embodiment of the present invention.

FIG. 6 is a flow chart describing a method of connecting, severing and reclaiming resources on a PCB according to the present invention. According to the method of the present invention, any connections that need to be made to a particular contact pad 355 having multiple connection pads connected via surface traces after a PCB has been manufactured are made to a primary connection pad 345 at 610. If later engineering change orders, circuit changes, testing changes or other reasons call for removing a resource or contact pad 355 from a circuit, the end user may sever a surface trace between the primary connection pad and the resource or contact pad 355 at 620 and 630. After primary connection pad 345 has been severed from resource or contact pad 355, if later engineering, circuit, testing or other changes require contact with resource or contact pad 355, these connections may be made by making electrical connection with secondary connection pad 365, which is connected with resource or contact pad 355 via surface trace 385 at 640 and 650.

If still further circuit changes require removing resource or contact pad 355 from the circuit, the end user may desolder the connections to secondary pad 365, or alternatively, sever the trace 385 between secondary pad 365 and contact pad 355 at 660 and 670. Obviously, desoldering connections allows secondary connection pad 365 to remain a reusable resource for later connections to resource 355. As will be readily apparent, there may be additional connection pads connected to resource pad 355 by means of surface traces and additional connections may be made to those connection pads, which may also be later severed from the resource pad 355 with later change orders.

Referring now to FIGS. 7 through 10, various arrangements for a triple contact pad are illustrated. In each of these drawings, there is a resource or contact pad 210 connected to a secondary connection pad 220 via surface trace 222. A primary connection pad 230 is connected to resource pad 210 either directly or through secondary connection pad 220 via surface trace 232. Initial connections to resource pad 210 are made via connections made to primary connection pad 230 until a requirement to remove resource 210 from the circuit is made, at which time surface trace 232 is severed with an x-acto knife, laser, dermal tool or other known means. If resource 210 was disconnected in error or later circuit changes require connections to resource 210, connections to resource 210 may be made by making a connection with the secondary connection pad 220. If still later circuit changes or error corrections require removing resource 210, this may be accomplished by desoldering the connections to secondary connection pad 220, which would free up resource pad 210 without degrading the contact surface. Alternatively, connections may be made by severing surface trace 222 between secondary connection pad 220 and resource 210.

Figure 11:
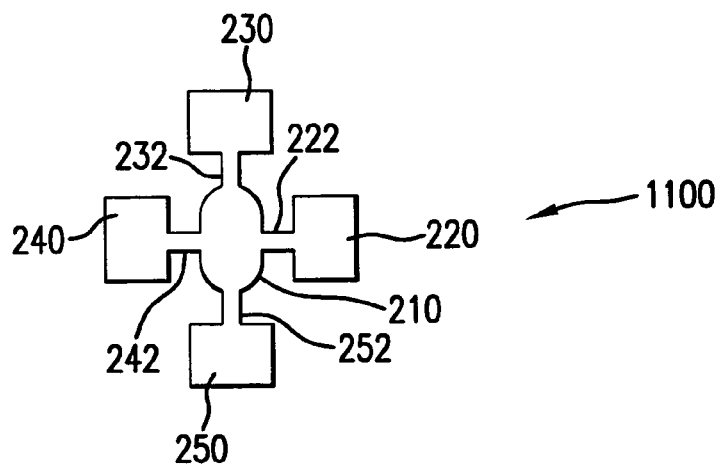
FIG. 11 illustrates a top view of a pad design according to a fifth embodiment of the present invention.

FIG. 11 illustrates a resource 210 with multiple connection pads 220, 230, 240 and 250 connected to resource 210 via surface traces 222, 232, 242 and 252. Multiple connection pad 1100 would operate in a similar manner described above, but would permit more connections, disconnections and reclaiming cycles in circuit changes. Such a multiple connection pad would be limited by surface area, resistive, capacitive and inductive parameters and circuit requirements, but may have multiple connection pads.

By way of example, a multiple pad may have a resource or contact pad 210 having approximately 25–60 mil pad made of any known contact pad material, such as gold plated copper. Primary connection pad 230 may be approximately 25–60 mils of any know contact pad material, such as gold plated copper. Secondary connection pad 220 may be approximately 25–60 mils of any known contact pad material, such as gold plated copper. Traces 222 and 232 may be approximately 10–30 mils in length, approximately 10–20 mils in width and made of any conductive trace material, such as gold plated copper. Traces need to be long enough to permit cutting by means of x-acto knife, laser, dermal tool or other know cutting means, but should not be so long or narrow as to degrade the electrical qualities of the resource pad. Connection pads 220, 230, 240, 250 may be approximately 40–60 mils from the resource pad 210, center to center.

In designing multiple contact pads, connection pads and connecting trace length, width and overall pad size, there needs to be a balancing of size versus electrical qualities. The multiple pad may be made of gold plated copper or any known electrically conductive contact pad material. The multiple pad structure of the present invention may be made by subtractive or additive printed circuit board manufacturing techniques or other known pad manufacturing method.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. For example, the triple pad design of the present invention may be implemented on both sides of a printed circuit board, rather than just one side.

Also, the pad design may have more than three pads. There may be more than one contact pad or no contact pad and just multiple connection pads. Also, extra resources comprising multiple connection pads without any initial electrical connections may be provided around the printed circuit board for later use when connection pads to resources have been eliminated and further engineering change orders require additional connections and resources. It is intended that the appended claims be construed to include other alternative embodiments of the invention except insofar as limited by the prior art.

What is claimed is:

1. A method, which comprises:
    (a) providing a fixture printed circuit board for an in-circuit tester having a circuit comprising a first resource and a multiple pad, the multiple pad comprising a contact pad, a primary connection pad, and a secondary connection pad in close proximity with each other and electrically connected to each other via traces, the primary connection pad having an electrical connection to the first resource;
    (b) determining whether the electrical connection between the contact pad and the first resource on the fixture printed circuit board for an in-circuit tester is required; and
    (c) changing the circuit on the fixture printed circuit board by severing the electrical connection between the primary connection pad and the contact pad.

2. The method according to claim 1 comprising the following further steps:
    (d) determining that an additional electrical connection is required to a second resource on the fixture printed circuit board, the second resource electrically isolated from the multiple pad: and
    (e) changing the circuit on the fixture printed circuit board by forming an electrical connection between the second resource and the secondary connection pad.

\* \* \* \* \*

UNITED STATES PATENT AND TRADEMARK OFFICE
CERTIFICATE OF CORRECTION

| | | |
|---|---|---|
| PATENT NO. | : 7,185,427 B2 | Page 1 of 1 |
| APPLICATION NO. | : 10/424615 | |
| DATED | : March 6, 2007 | |
| INVENTOR(S) | : Willard et al. | |

It is certified that error appears in the above-identified patent and that said Letters Patent is hereby corrected as shown below:

In column 8, line 32 (Approx.), in Claim 2, after "claim 1" insert -- , --.

Signed and Sealed this

Twenty-sixth Day of June, 2007

JON W. DUDAS
*Director of the United States Patent and Trademark Office*